(12) United States Patent
Nakagawa et al.

(10) Patent No.: US 8,787,033 B2
(45) Date of Patent: Jul. 22, 2014

(54) ELECTRONIC COMPONENT AND ELECTRONIC DEVICE

(75) Inventors: Hitoshi Nakagawa, Okazaki (JP); Gen Tokuyama, Okazaki (JP); Yuki Mizuno, Okazaki (JP)

(73) Assignee: Aisin AW Co., Ltd., Aichi-ken (JP)

( * ) Notice: Subject to any disclaimer, the term of this patent is extended or adjusted under 35 U.S.C. 154(b) by 378 days.

(21) Appl. No.: 13/235,111

(22) Filed: Sep. 16, 2011

(65) Prior Publication Data

US 2012/0106116 A1    May 3, 2012

(30) Foreign Application Priority Data

Oct. 27, 2010    (JP) .................................. 2010-241338

(51) Int. Cl.
*H05K 1/11*    (2006.01)
(52) U.S. Cl.
USPC .......................................................... 361/803
(58) Field of Classification Search
USPC .......................................................... 361/803
See application file for complete search history.

(56) References Cited

U.S. PATENT DOCUMENTS

| 3,599,326 | A * | 8/1971 | DiRenzo ........................ 29/843 |
| 6,169,253 | B1 * | 1/2001 | Jairazbhoy et al. ........... 174/250 |
| 6,267,009 | B1 * | 7/2001 | Drewes et al. .................. 73/718 |
| 2008/0003803 | A1 * | 1/2008 | Tsao et al. ..................... 438/613 |
| 2011/0136336 | A1 * | 6/2011 | Akram et al. ................. 438/613 |

FOREIGN PATENT DOCUMENTS

| JP | 2859143 B2 | 2/1999 |
| JP | 2005-223090 A | 8/2005 |
| JP | 2010-073903 A | 4/2010 |

OTHER PUBLICATIONS

Office Action dated Aug. 14, 2013 issued in Japanese Patent Application No. 2010-241338.

* cited by examiner

*Primary Examiner* — Forrest M Phillips
(74) *Attorney, Agent, or Firm* — Sughrue Mion, PLLC

(57) ABSTRACT

An electronic component to be mounted on a substrate, including an electronic component-side land that faces a substrate-side land provided on the substrate when the electronic component is mounted on the substrate. A non-soldered region is provided on a surface of the electronic component-side land, facing the substrate-side land, so that a shape of the substrate-side land is different from a shape of the electronic component-side land facing the substrate-side land.

7 Claims, 7 Drawing Sheets

ELECTRONIC COMPONENT AND ELECTRONIC DEVICE

INCORPORATION BY REFERENCE

The disclosure of Japanese Patent Application No. 2010-241338 filed on Oct. 27, 2010 including the specification, drawings and abstract is incorporated herein by reference in its entirety.

BACKGROUND OF THE INVENTION

1. Field of the Invention

The present invention relates to an electronic component and an electronic device.

2. Description of the Related Art

In an existing art, soldering copper foils (hereinafter, referred to as "lands") for mounting an electronic component on a substrate are provided on the substrate and the electronic component. Particularly, in recent years, in order to reduce the footprint of an electronic component on a substrate, packaging, such as ball grid array (BGA) and land grid array (LGA), is utilized to provide lands directly below the electronic component.

In an electronic component soldered to a substrate via lands in this way, in order to improve the reliability of connection of connecting land portions, there has been suggested a module component in which reinforcement lands having an area that is three times or more of the area of one connecting land is provided near the outermost periphery of connecting lands that are arranged in a grid on the back surface of a module substrate (for example, see Japanese Patent No. 2859143).

SUMMARY OF INVENTION

There is a possibility that voids are generated in a soldered portion because of the surface tension of solder, gas generated from an electronic component or a base material during reflowing, or the like. Particularly, if lands having a large area are provided as in the case of the above described existing component, there is a possibility that the frequency of occurrence of voids increases, and the size of each void generated increases. In this way, if excessive amounts of voids are generated in a soldered portion and then the voids remain in the soldered portion, a soldered area between an electronic component and a substrate reduces and may lead to deterioration of electrical characteristic and thermal conductivity.

The present invention provides an electronic component and an electronic device in which residual voids in a soldered portion is reduced to make it possible to stably ensure an appropriate soldered area between the electronic component and a substrate.

A first aspect of the invention provides an electronic component to be mounted on a substrate. The electronic component includes: an electronic component-side land that faces a substrate-side land provided on the substrate when the electronic component is mounted on the substrate, wherein a non-soldered region is provided on a surface of the electronic component-side land, facing the substrate-side land, so that a shape of the substrate-side land is different from a shape of the electronic component-side land facing the substrate-side land.

With the electronic component according to the first aspect, the non-soldered region is provided on the surface of the electronic component-side land, facing the substrate-side land, so that the shape of the substrate-side land is different from the shape of the electronic component-side land facing the substrate-side land, so gas in generated voids may be emitted outside a soldered portion via a gap formed between the non-soldered region and the substrate-side land. By so doing, residual voids in the soldered portion are reduced to thereby make it possible to stably ensure the appropriate soldered area between the electronic component and the substrate.

A second aspect of the invention provides an electronic component to be mounted on a substrate. The electronic component includes: electronic component-side lands that respectively face substrate-side lands provided on the substrate when the electronic component is mounted on the substrate, wherein the electronic component-side lands include a grounding land that is provided substantially at a center of a surface of the electronic component, facing the substrate, and input/output lands that are provided around the grounding land, the input/output lands include a reinforcement land that is provided near an outer periphery of the surface of the electronic component, facing the substrate, and that is formed to have an area larger than that of the other input/output land, and a non-soldered region is provided on a surface of the reinforcement land, facing the substrate-side land, so that a shape of the substrate-side land is different from a shape of the reinforcement land facing the substrate-side land.

With the electronic component according to the second aspect, the non-soldered region is provided on the surface of the reinforcement land, facing the substrate-side land, so that the shape of the substrate-side land is different from the shape of the reinforcement land facing the substrate-side land, so gas in generated voids may be emitted outside a soldered portion via a gap formed between the non-soldered region and the substrate-side land. By so doing, residual voids in the soldered portion between the reinforcement land and the substrate-side land, in which voids are particularly easily generated, are reduced to thereby make it possible to stably ensure the appropriate soldered area between the electronic component and the substrate.

A third aspect of the invention provides an electronic device. The electronic device includes: a substrate that includes a substrate-side land; and an electronic component that includes an electronic component-side land facing the substrate-side land when the electronic component is mounted on the substrate, wherein a non-soldered region is provided on at least one of a surface of the substrate-side land, facing the electronic component-side land, and a surface of the electronic component-side land, facing the substrate-side land, so that a shape of the substrate-side land is different from a shape of the electronic component-side land facing the substrate-side land.

With the electronic device according to the third aspect, the non-soldered region is provided on at least one of the surface of the substrate-side land, facing the electronic component-side land, and the surface of the electronic component-side land, facing the substrate-side land, so that the shape of the substrate-side land is different from the shape of the electronic component-side land facing the substrate-side land, so gas in generated voids may be emitted outside a soldered portion via a gap formed between the non-soldered region and the substrate-side land. By so doing, residual voids in the soldered portion are reduced to thereby make it possible to stably ensure the appropriate soldered area between the electronic component and the substrate.

BRIEF DESCRIPTION OF DRAWINGS

The features, advantages, and technical and industrial significance of this invention will be described below with reference to the accompanying drawings, in which like numerals denote like elements, and wherein:

FIG. 1A and FIG. 1B are views that illustrate an electronic component, in which FIG. 1A is a side view of the electronic component and FIG. 1B is a plan view of the electronic component;

FIG. 2A and FIG. 2B are views that illustrate a substrate, in which FIG. 2A is a plan view of the substrate and FIG. 2B is a side view of the substrate;

FIG. 3A and FIG. 3B are views that show a state where the electronic component is mounted on the substrate, in which FIG. 3A is a side cross-sectional view that illustrates a state where solder is supplied between each electronic component-side land and a corresponding substrate-side land, and FIG. 3B is a side cross-sectional view that illustrates a state after the electronic component is mounted on the substrate;

FIG. 4A and FIG. 4B are views that show a state where an electronic component is mounted on a substrate according to an alternative embodiment, in which FIG. 4A is a side cross-sectional view that illustrates a state where solder is supplied between each electronic component-side land and a corresponding substrate-side land, and FIG. 4B is a side cross-sectional view that illustrates a state after the electronic component is mounted on the substrate;

FIG. 7A and FIG. 7B are views that illustrate a case where some electronic component-side lands and some substrate-side lands are divided by grooves, in which FIG. 7A is a side cross-sectional view that illustrates a state where solder is supplied between each electronic component-side land and a corresponding substrate-side land, and FIG. 7B is a side cross-sectional view that illustrates a state after the electronic component is mounted on the substrate.

DETAILED DESCRIPTION OF EMBODIMENTS

Hereinafter, an embodiment of an electronic component and an electronic device according to the aspect of the present invention will be described in detail with reference to the accompanying drawings. However, the aspect of the present invention is not limited to the embodiment. In addition, in the following description, a "land" means a soldering metal thin film (copper foil, or the like) for mounting an electronic component to a substrate.

Figure 1A:
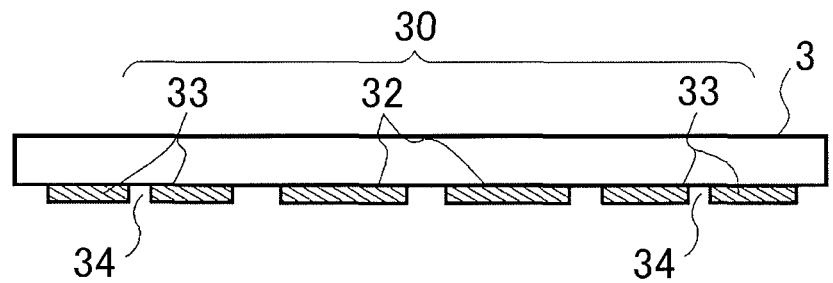
Figure 1B:
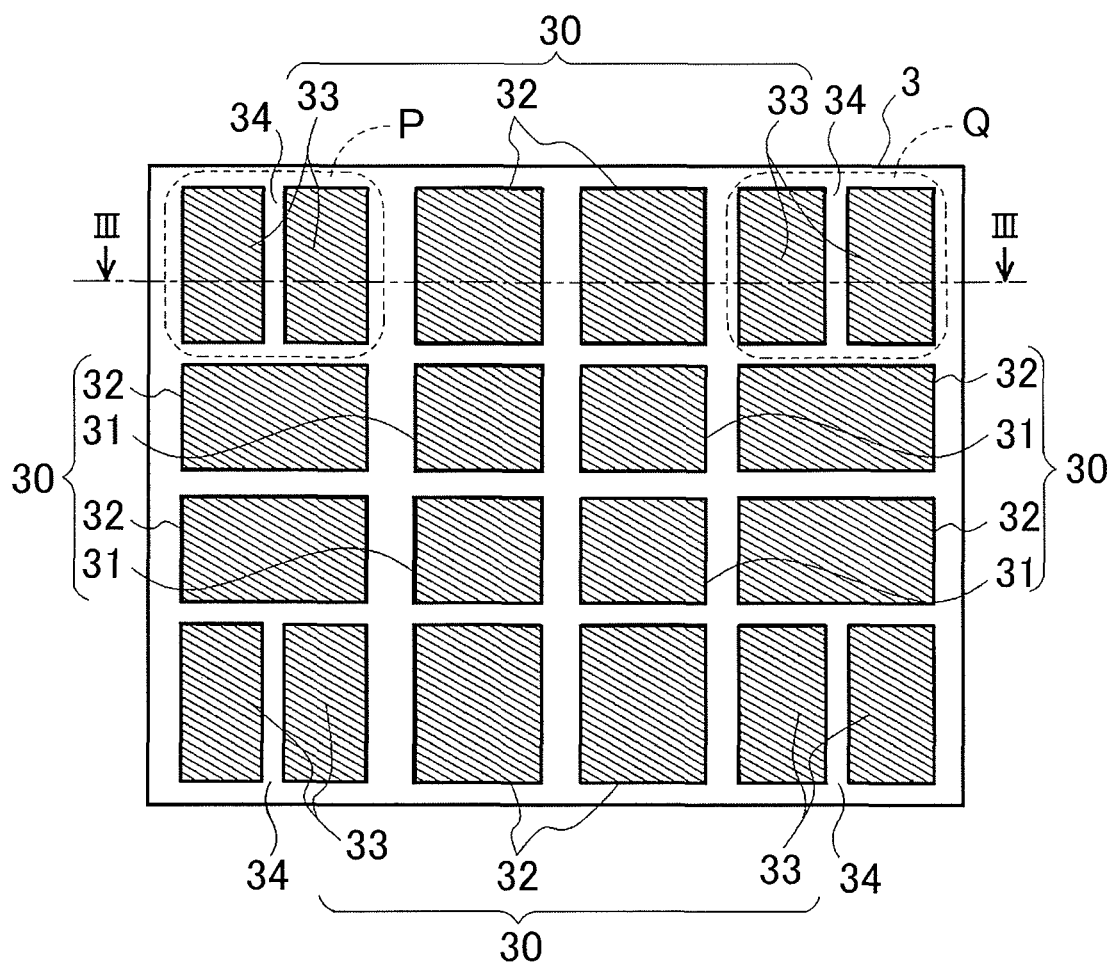
Figure 2A:
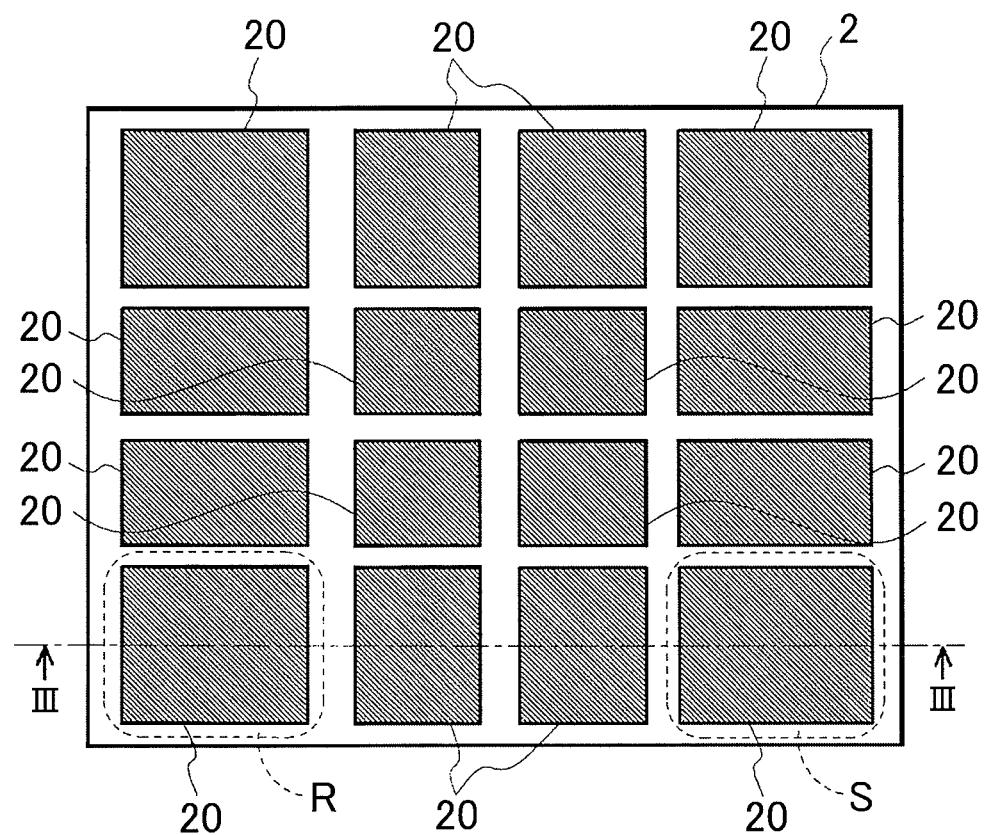
Figure 2B:
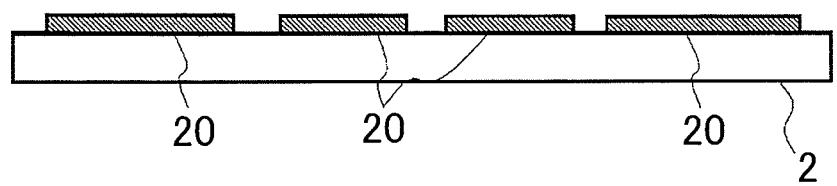

First, the configuration of an electronic device according to the embodiment will be described. The electronic device includes a substrate and an electronic component that is mounted on the substrate. FIG. 1A and FIG. 1B are views that illustrate the electronic component, in which FIG. 1A is a side view of the electronic component and FIG. 1B is a plan view of the electronic component. In addition, FIG. 2A and FIG. 2B are views that illustrate the substrate, in which FIG. 2A is a plan view of the substrate and FIG. 2B is a side view of the substrate.

The electronic component will be described below. As shown in FIG. 1A and FIG. 1B, the electronic component 3 includes electronic component-side lands 30. The electronic component-side lands 30 face substrate-side lands on the substrate when the electronic component 3 is mounted on the substrate. The electronic component-side lands 30 are formed as thin films made of metal, such as copper, having a desired shape by a known method, such as etching and additive process, on a surface of the electronic component 3, facing the substrate. FIG. 1A and FIG. 1B illustrate a case where the plurality of electronic component-side lands 30 having a rectangular planar shape are provided.

The electronic component-side lands will be described below. The electronic component-side lands 30 include grounding lands 31 and input/output lands 32. The grounding lands 31 are lands for grounding the electronic component 3, and are provided substantially at the center of the surface of the electronic component 3, facing the substrate. The input/output lands 32 are lands for inputting or outputting signals between the electronic component 3 and the substrate, and are provided around the grounding lands 31. In addition, the input/output lands 32 include reinforcement lands 33. The reinforcement lands 33 are lands for inputting or outputting signals between the electronic component 3 and the substrate, and for reinforcing connection between the electronic component 3 and the substrate. The reinforcement lands 33 are provided near the outer periphery (corner portions in the present embodiment) of the surface of the electronic component 3, facing the substrate. The reinforcement lands 33 each have an area larger than those of the other input/output lands 32. Note that the area of each reinforcement land 33 is equal among the reinforcement lands 33. In this way, by providing the reinforcement lands 33 each having an area larger than those of the other input/output lands 32 at the corner portions (four corners in FIG. 1B) of the electronic component 3, occurrence of a fatigue crack/break in solder at soldered portions between the electronic component 3 and the substrate is suppressed to thereby make it possible to improve connection reliability. The details of the shapes of these electronic component-side lands 30 will be described later.

The configuration of the substrate will be described below. As shown in FIG. 2A and FIG. 2B, the substrate 2 includes substrate-side lands 20. The substrate-side lands 20 are formed as thin films made of metal, such as copper, having a desired shape by a known method, such as etching and additive process, on a surface of the substrate 2, facing the electronic component 3. FIG. 2A and FIG. 2B illustrate a case where the plurality of substrate-side lands 20 having a rectangular planar shape are provided. These substrate-side lands 20 and electronic component-side lands 30 facing the substrate-side lands 20 are placed in pairs at respective arrangement positions. The details of the shape of each substrate-side land 20 will be described later.

Next, the shape of each electronic component-side land 30 and the shape of each substrate-side land 20 will be described. The shape of each electronic component-side land 30 other than the reinforcement land 33 (that is, the grounding land 31 and the input/output land 32 other than the reinforcement land 33) is formed to be substantially the same as the shape of each substrate-side land 20 facing the corresponding electronic component-side land 30 (that is, the substrate-side land 20 that is paired with the corresponding electronic component-side land 30).

On the other hand, in the reinforcement lands 33, in order to vary the shape of each substrate-side land 20 from the shape of each reinforcement land 33 facing the substrate-side land 20, a groove 34 that serves as a non-soldered region is provided on the surface of each reinforcement land 33, facing the substrate-side land 20. Here, the "non-soldered region" means a region on a land to which solder does not adhere. For example, a non-soldered region may be physically formed by providing a groove in a land or a non-soldered region may be formed by providing a solder resist layer on a land. In the present embodiment, each reinforcement land 33 is divided by the groove 34, and the planar shape of each reinforcement land 33 divided by the groove 34 is different from the planar shape of the substrate-side land 20 at the position facing the reinforcement land 33.

For example, when the electronic component 3 is mounted on the substrate 2, the reinforcement land 33 surrounded by the dotted line P in FIG. 1B faces the substrate-side land 20 surrounded by the dotted line R in FIG. 2A. In this case, the reinforcement land 33 surrounded by the dotted line P in FIG. 1B is divided by the groove 34; whereas the substrate-side land 20 at the position facing the reinforcement land 33 (the substrate-side land 20 surrounded by the dotted line R in FIG. 2A) is not divided by a groove, so the planar shape of the reinforcement land 33 is different from the planar shape of the substrate-side land 20 facing the reinforcement land 33. Similarly, the reinforcement land 33 surrounded by the dotted line Q in FIG. 1B is divided by the groove 34; whereas the substrate-side land 20 at the position facing the reinforcement land 33 (the substrate-side land 20 surrounded by the dotted line S in FIG. 2A) is not divided by a groove, so the planar shape of the reinforcement land 33 is different from the planar shape of the substrate-side land 20 facing the reinforcement land 33.

Figure 3A:
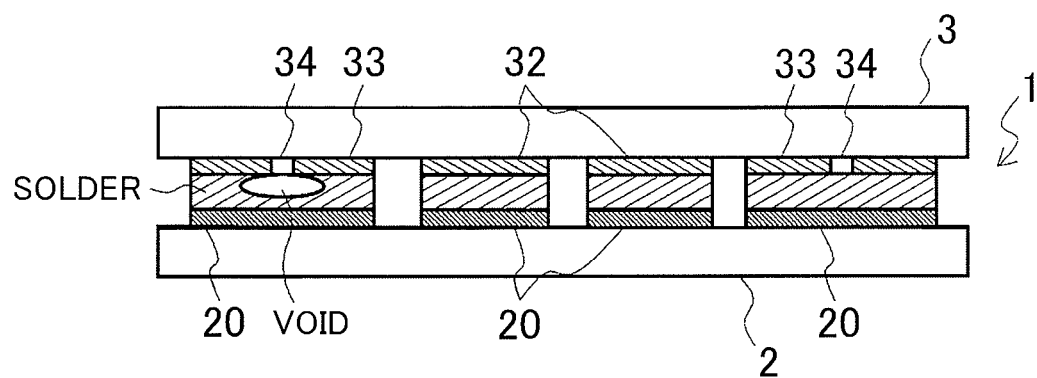
Figure 3B:
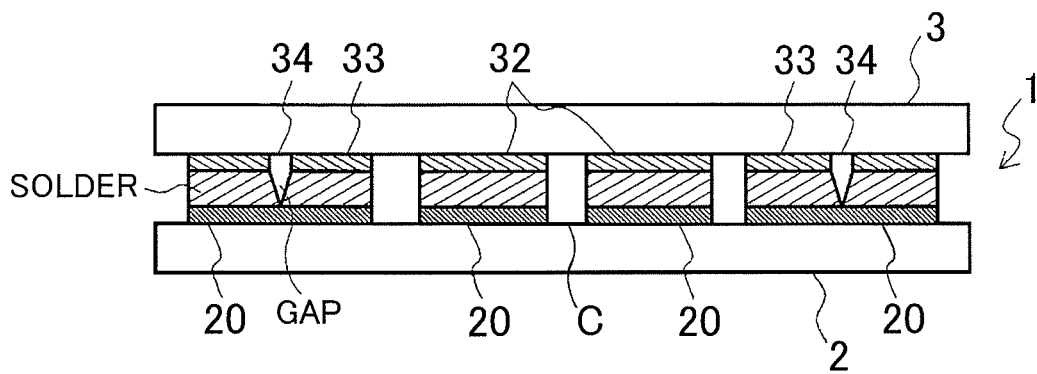

Next, the function of the thus configured electronic component 3 and electronic device will be described. FIG. 3A and FIG. 3B are views that show a state where the electronic component 3 is mounted on the substrate 2, in which FIG. 3A is a side cross-sectional view that illustrates a state where solder is supplied between each electronic component-side land 30 and a corresponding one of the substrate-side lands 20, and FIG. 3B is a side cross-sectional view that illustrates a state after the electronic component 3 is mounted on the substrate 2. Note that FIG. 3A and FIG. 3B show the III-III cross-sectional views of the electronic component 3 illustrated in FIG. 1B and the substrate 2 illustrated in FIG. 2A.

For example, when solder is supplied between each electronic component-side land 30 and a corresponding one of the substrate-side lands 20 by a known soldering method, such as reflow soldering, as illustrated in FIG. 3A, voids may be generated in solder between each substrate-side land 20 and a corresponding one of the electronic component-side lands 30 having a relatively large area among the electronic component-side lands 30 (for example, the reinforcement lands 33 that have the largest area among the plurality of electronic component-side lands 30 provided near the outer periphery of the surface of the electronic component 3, facing the substrate 2, and the electronic component-side land 30 having the largest area among all the electronic component-side lands 30). In the case of the existing electronic component, such voids are enclosed by the reinforcement land, the substrate-side land and the surrounding solder and remain in the soldered portion after solder is cooled, so the soldered area between the electronic component and the substrate reduces.

In contrast, in the present embodiment, the groove 34 is provided on the surface of each reinforcement land 33, facing the substrate-side land 20, so gas in the generated voids is emitted outside the soldered portion via a gap formed between each groove 34 and the corresponding substrate-side land 20. As a result, as shown in FIG. 3B, a space between each reinforcement land 33 and the corresponding substrate-side land 20 is filled with solder except a V-shaped gap portion formed between the position of the groove 34 of the reinforcement land 33 and the substrate-side land 20. By so doing, in comparison with the case where voids remain in the soldered portions, it is possible to ensure the sufficient soldered area between the electronic component 3 and the substrate 2.

In addition, when each of the surface of each electronic component-side land 30, facing the corresponding substrate-side land 20, and the surface of each substrate-side land 20, facing the corresponding electronic component-side land 30, has a groove and then each of these electronic component-side land 30 and substrate-side land 20 is completely divided by the groove so that the shape of each substrate-side land 20 is the same as the shape of the corresponding electronic component-side land 30 facing the substrate-side land 20, for example, as in the case of the portion C in FIG. 3B, solder does not flow between the groove of each electronic component-side land 30 and the groove of the corresponding substrate-side land 20. Thus, a gap having a rectangular cross section is formed between the groove of each electronic component-side land 30 and the groove of the corresponding substrate-side land 20. Therefore, the soldered area between the electronic component 3 and the substrate 2 reduces.

In contrast, in the present embodiment, no groove is provided for each substrate-side land 20, and only each reinforcement land 33 is divided by the groove 34. By so doing, the planar shape of each reinforcement land 33 is different from the planar shape of the substrate-side land 20 at the position facing the electronic component-side land. Therefore, no solder flows to the positions of the grooves 34 of the reinforcement lands 33; however, solder flows to the surfaces of the substrate-side lands 20. By so doing, as shown in FIG. 3B, a V-shaped gap is formed between the groove 34 of the reinforcement land 33 and the corresponding substrate-side land 20. Thus, in comparison with the state where a gap having a rectangular cross section is formed between the groove of each reinforcement land 33 and the groove of the corresponding substrate-side land 20, the sufficient soldered area between the electronic component 3 and the substrate 2 may be ensured.

In this way, according to the present embodiment, the groove 34 is provided on the surface of each reinforcement land 33, facing the corresponding substrate-side land 20, so that the shape of each substrate-side land 20 is different from the shape of the corresponding reinforcement land 33 facing the substrate-side land 20, so gas in the generated voids may be emitted outside the soldered portion via the gap formed between each groove 34 and the corresponding substrate-side land 20. By so doing, residual voids in the soldered portions are reduced to thereby make it possible to stably ensure the appropriate soldered area between the electronic component 3 and the substrate 2.

Particularly, the groove 34 is provided for each electronic component-side land 30 having the largest area (each reinforcement land 33 in the present embodiment) among the plurality of electronic component-side lands 30. By so doing, residual voids in the soldered portion between each reinforcement land 33 and the corresponding substrate-side land 20, in which voids are particularly easily generated, are reduced to thereby make it possible to stably ensure the appropriate soldered area between the electronic component 3 and the substrate 2.

In addition, the groove 34 is provided for each electronic component-side land 30 having the largest area (each reinforcement land 33 in the present embodiment) among the plurality of electronic component-side lands 30 provided near the outer periphery of the surface of the electronic component 3, facing the substrate 2. By so doing, residual voids in the soldered portion between each reinforcement land 33 and the corresponding substrate-side land 20, in which voids are particularly easily generated, are reduced to thereby make it possible to stably ensure the appropriate soldered area between the electronic component 3 and the substrate 2.

In addition, the planar shape of each reinforcement land 33 divided by the groove 34 is different from the planar shape of the substrate-side land 20 at the position facing the reinforcement land 33, so a V-shaped gap is formed between the groove 34 of each reinforcement land 33 and the corresponding substrate-side land 20. By so doing, in addition to the above described basic advantageous effects, it is possible to ensure the sufficient soldered area between the electronic component 3 and the substrate 2 in comparison with a state where a gap having a rectangular cross section is formed between the groove of each reinforcement land 33 and the groove of the corresponding substrate-side land 20.

In addition, the groove 34 is provided on the surface of each reinforcement land 33, facing the corresponding substrate-side land 20, as the non-soldered region, so gas in the generated voids may be emitted outside the soldered portion via the gap formed between each groove 34 and the corresponding substrate-side land 20.

The embodiment according to the aspect of the invention is described above; however, the specific configuration and manner according to the aspect of the invention may be arbitrarily modified or improved within the scope of the technical ideas recited in the appended claims. Hereinafter, such alternative embodiments will be described.

First, problems to be solved by the aspect of the invention and the advantageous effects of the aspect of the invention are not limited to the above described ones; they may vary depending on an environment in which the aspect of the invention is implemented or the details of the configuration, and only part of the above described problems may be solved or only part of the above described advantageous effects may be obtained.

Figure 4A:
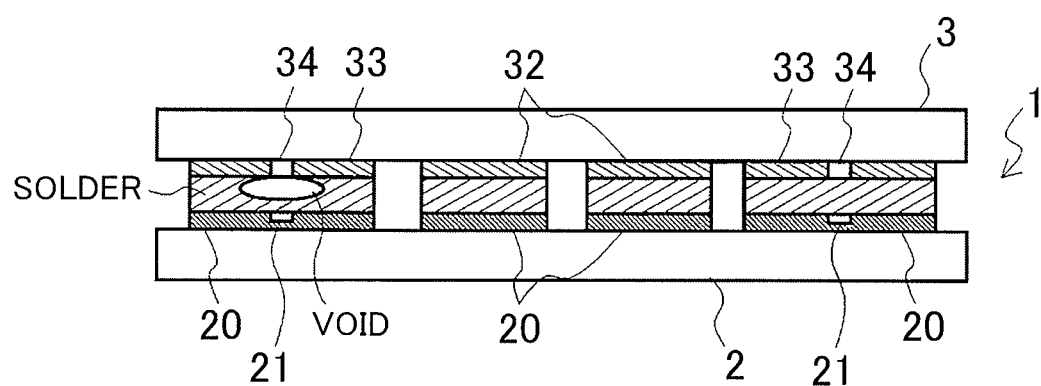
Figure 4B:
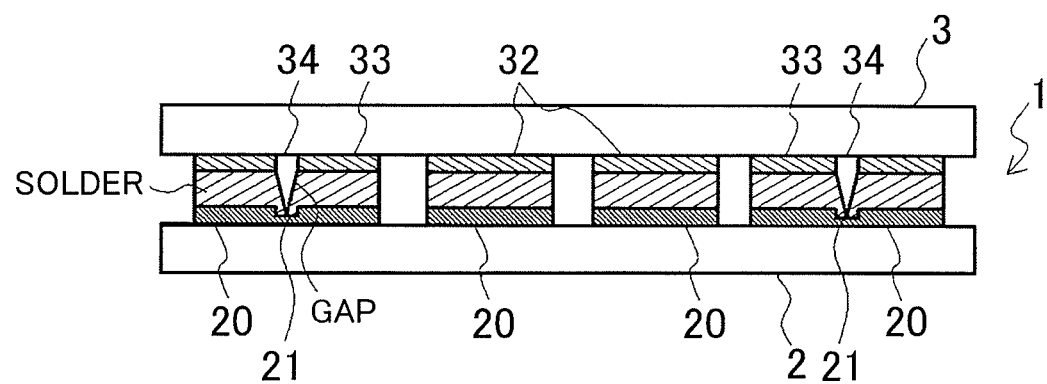

In the above described embodiment, each reinforcement land 33 is divided by the groove 34 and thus the planar shape of each reinforcement land 33 divided by the groove 34 is different from the planar shape of the substrate-side land 20 at the position facing the reinforcement land 33; instead, the thickness of the reinforcement land 33 at the position of the groove 34 may be different from the thickness of the substrate-side land 20 at the position facing the groove 34. FIG. 4A and FIG. 4B are views that show a state where an electronic component 3 is mounted on a substrate 2 according to an alternative embodiment, in which FIG. 4A is a side cross-sectional view that illustrates a state where solder is supplied between each electronic component-side land 30 and a corresponding substrate-side land 20, and FIG. 4B is a side cross-sectional view that illustrates a state after the electronic component 3 is mounted on the substrate 2. In the example of FIG. 4A and FIG. 4B, as well as the above described embodiment, each reinforcement land 33 is divided by a groove 34, and, in addition, each substrate-side land 20 also has a groove 21 at the position facing the groove 34 of the reinforcement land 33. However, the thickness of each reinforcement land 33 at the position of the groove 34 of the reinforcement land 33 is 0, that is, each reinforcement land 33 is completely divided by the groove 34; whereas the thickness of each substrate-side land 20 at the position of the groove 34 (that is, the position of the groove 21 of the substrate-side land 20) is set to a predetermined thickness larger than 0. Note that the groove 21 of each substrate-side land 20 is provided so as to be open toward the surface of the substrate-side land 20, facing the reinforcement land 33. When solder is supplied between the thus configured reinforcement land 33 and substrate-side land 20, no solder flows to the position of the groove 34 of the completely divided reinforcement land 33; however, solder flows to the surface of the substrate-side land 20 that is not completely divided, including the position of the groove 21. By so doing, as shown in FIG. 4B, a V-shaped gap is formed between the groove 34 of each reinforcement land 33 and the groove 21 of the corresponding substrate-side land 20. Thus, in comparison with a state where a gap having a rectangular cross section is formed between the groove of each reinforcement land 33 and the groove of the corresponding substrate-side land 20, it is possible to ensure the sufficient soldered area between the electronic component 3 and the substrate 2.

Figure 5:
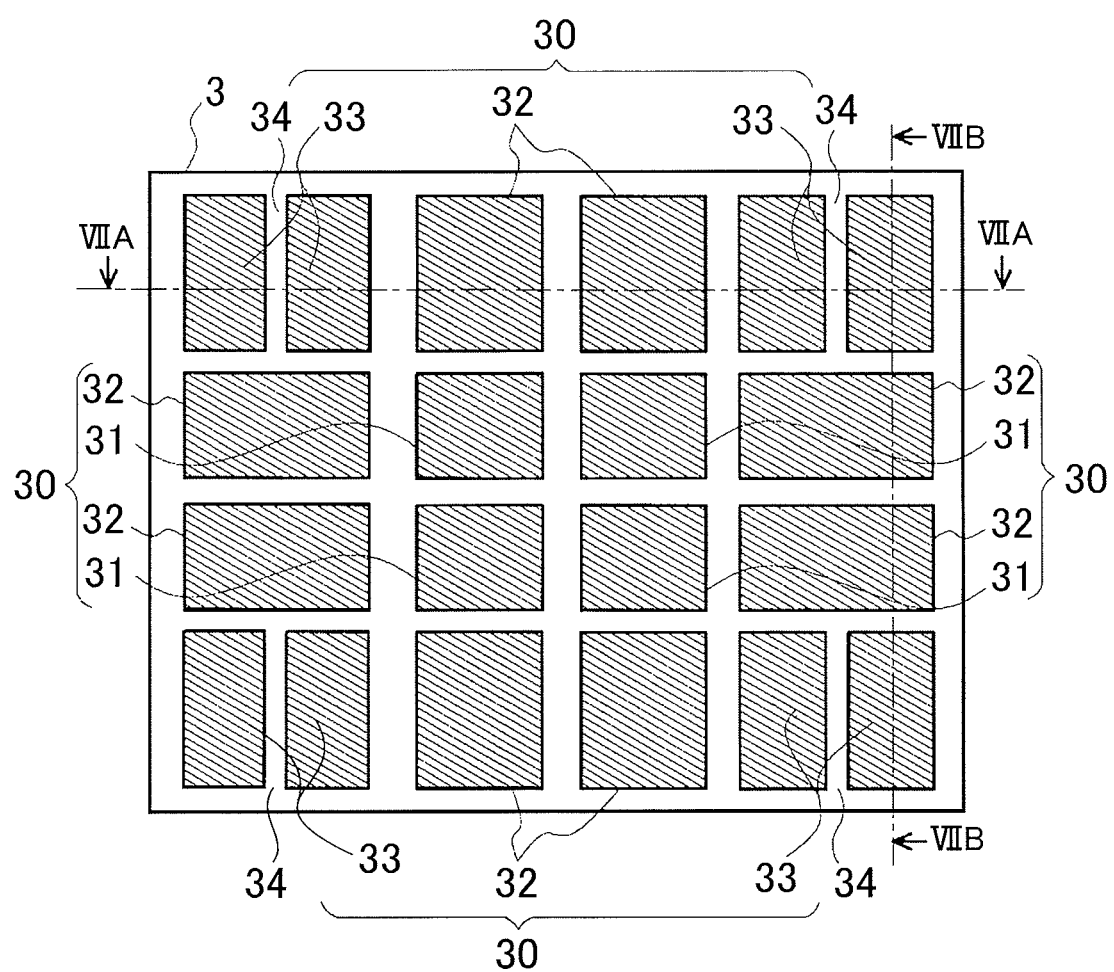
FIG. 5 is a plan view of an electronic component in the case where some electronic component-side lands and some substrate-side lands are divided by grooves.
Figure 6:
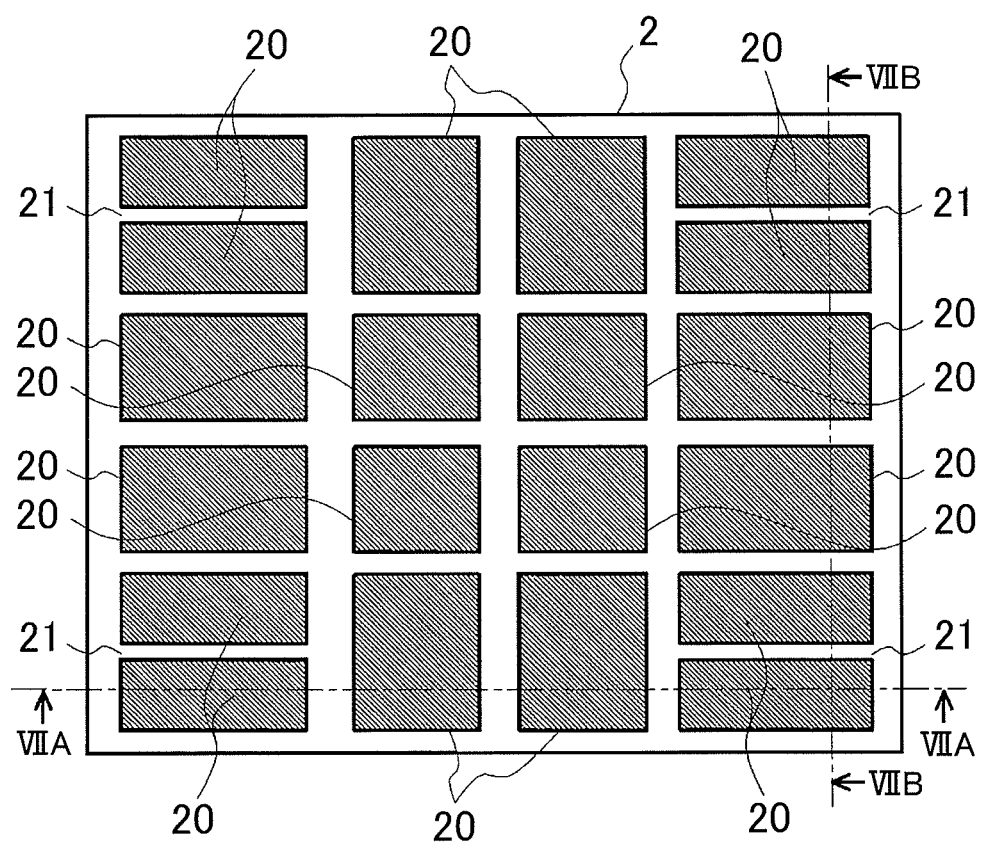
FIG. 6 is a plan view of a substrate in the case where some electronic component-side lands and some substrate-side lands are divided by grooves.
Figure 7A:
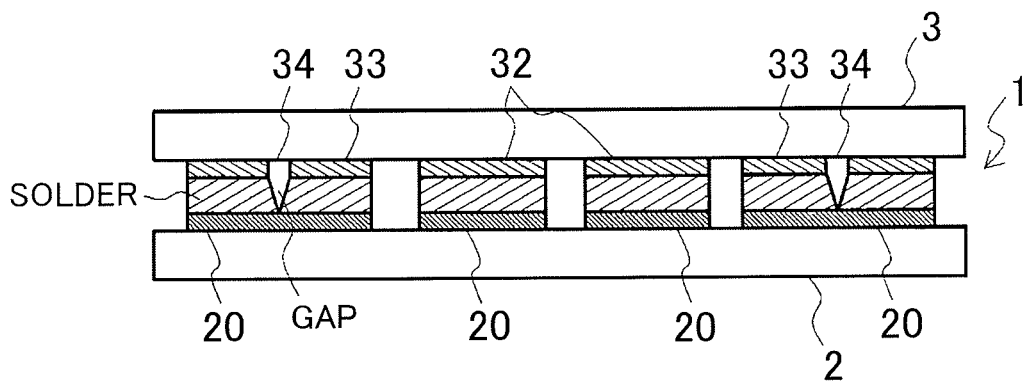
Figure 7B:
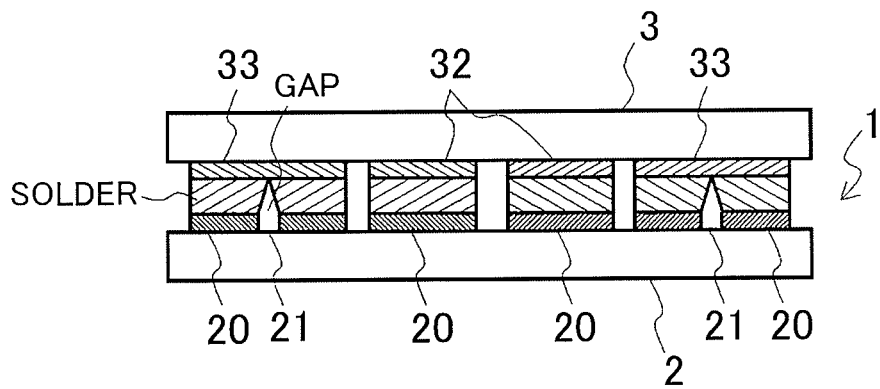

In addition, in the above described embodiment, no groove is provided for each substrate-side land 20 and only each reinforcement land 33 is divided by the groove 34; instead, in addition to each reinforcement land 33 (electronic component-side land 30), each substrate-side land 20 may also be divided by a groove 21. FIG. 5 is a plan view of an electronic component 3 when each substrate-side land 20 is also divided by the groove 21. FIG. 6 is a plan view of a substrate 2 when each substrate-side land 20 is also divided by the groove 21. FIG. 7A and FIG. 7B are views that illustrate a case where each substrate-side land 20 is also divided by the groove 21, in which FIG. 7A is a side cross-sectional view that illustrates a state where solder is supplied between each electronic component-side land 30 and a corresponding substrate-side land 20, and FIG. 7B is a side cross-sectional view that illustrates a state after the electronic component 3 is mounted on the substrate 2. Note that FIG. 7A shows the VIIA-VIIA cross-sectional views of the electronic component 3 illustrated in FIG. 5 and the substrate 2 illustrated in FIG. 6, and FIG. 7B shows the VIIB-VIIB cross-sectional views of the electronic component 3 illustrated in FIG. 5 and the substrate 2 illustrated in FIG. 6.

In the example shown in FIG. 5 to FIG. 7B, when the electronic component 3 is mounted on the substrate 2, the reinforcement lands 33 and the substrate-side lands 20 are formed so that the groove 34 of each reinforcement land 33 intersects with the groove 21 of the corresponding substrate-side land 20 facing the reinforcement land 33. In this case, as shown in FIG. 7A and FIG. 7B, a space between each reinforcement land 33 and the corresponding substrate-side land 20 is filled with solder except the V-shaped gap portion formed between the position of the groove 34 of the reinforcement land 33 and the substrate-side land 20 and the V-shaped gap portion formed between the reinforcement land 33 and the position of the groove 21 of the substrate-side land 20. By so doing, gas in the generated voids may be emitted outside the soldered portion via the gap formed between the groove 34 of the reinforcement land 33 and the substrate-side land 20 and the gap formed between the groove 21 of the substrate-side land 20 and the electronic component-side land 30, so it is possible to further reliably reduce residual voids while stably ensuring the appropriate soldered area between the electronic component 3 and the substrate 2.

In addition, in the above described embodiment, no groove is provided for each substrate-side land 20 and only each reinforcement land 33 is divided by the groove 34; instead, only each substrate-side land 20 facing the reinforcement land 33 may be divided by a groove and no groove may be provided for each reinforcement land 33. In this case as well, gas in the generated voids may be emitted outside the soldered portion via the gap formed between the groove of the substrate-side land 20 and the corresponding electronic component-side land 30. By so doing, residual voids in the soldered portions are reduced to thereby make it possible to stably ensure the appropriate soldered area between the electronic component 3 and the substrate 2.

In addition, in the above described embodiment, the groove 34 is provided for each reinforcement land 33; instead, not only the reinforcement land 33 but also the other electronic component-side land 30 each may have a groove. In this case, a groove may be provided for all the electronic component-side lands 30 or a groove may be provided for only part of the electronic component-side lands 30.

In addition, in the above described embodiment, only one groove 34 is provided for each reinforcement land 33; instead, a plurality of the grooves 34 may be provided for each reinforcement land 33. For example, two grooves 34 may be provided for each reinforcement land 33 so as to intersect with each other. By so doing, it is possible to further effectively reduce residual voids in the soldered portions.

In addition, in the above described embodiment, a V-shaped gap is formed between the groove 34 of each reinforcement land 33 and the corresponding substrate-side land 20; however, the shape of the gap formed is not limited to the V shape. The shape of the gap formed may be another shape, such as a U shape.

In addition, in the above described embodiment, the reinforcement land 33 is provided at each corner portion of the surface of the electronic component 3, facing the substrate; instead, the reinforcement land 33 may be provided at a selected position near the outer periphery of the surface of the electronic component 3, facing the substrate (for example, at predetermined intervals over all around the outer periphery).

In addition, in the above described embodiment, the groove 34 is provided on the surface of the electronic component-side land 30, facing the substrate-side land 20, as the non-soldered regions; instead, a solder resist layer may be provided on the surface of the electronic component-side land 30, facing the substrate-side land 20, as a non-soldered region. In this way, by providing the solder resist layer on the electronic component-side land 30, the shape of the soldered portion of the substrate-side land 20 is different from the shape of the soldered portion of the electronic component-side land 30 facing the substrate-side land 20. That is, in view of the function of the land that is connected by solder, the shape of the substrate-side land 20 is different from the shape of the electronic component-side land 30 facing the substrate-side land 20.

Figure 8:
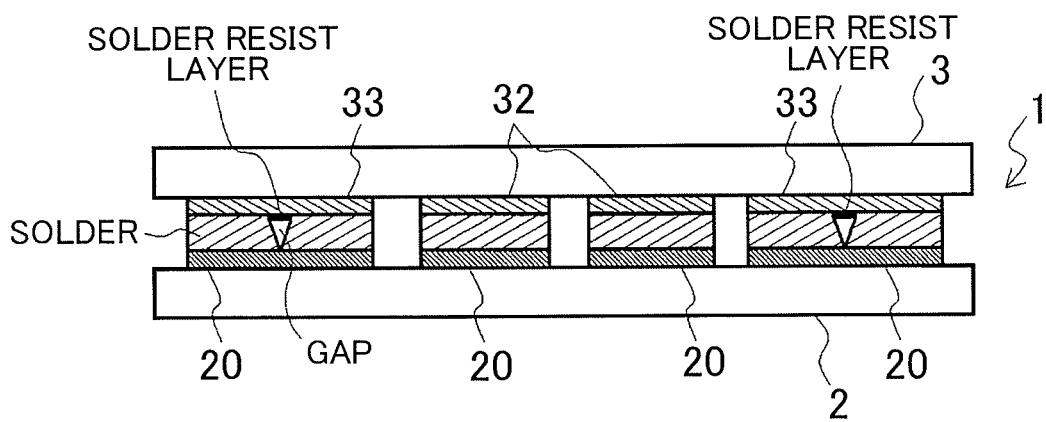
FIG. 8 is a side cross-sectional view that illustrates a state after the electronic component is mounted on the substrate.

For example, a solder resist layer is formed in a band shape on the surface of each reinforcement land 33, facing the substrate-side land 20, to divide the reinforcement land 33 with the solder resist layer. By so doing, the planar shape of the reinforcement land 33 divided by the solder resist layer is different from the planar shape of the substrate-side land 20 at the position facing the reinforcement land 33. FIG. 8 is a side cross-sectional view that illustrates a state after the electronic component 3 is mounted on the substrate 2. In this case, when solder is supplied between each electronic component-side land 30 and the corresponding substrate-side land 20, no solder adheres to the solder resist layer, so, as shown in FIG. 8, a V-shaped gap portion is formed between the position of the solder resist layer of each reinforcement land 33 and the corresponding substrate-side land 20. In this way, by providing the solder resist layer on the surface of the electronic component-side land 30, facing the substrate-side land 20, as a non-soldered region, a non-soldered region may be easily formed on the electronic component-side land 30, and gas in the generated voids may be emitted outside the soldered portion via the gap formed between the solder resist layer and the substrate-side land 20.

In addition, a solder resist layer may be provided on the surface of the substrate-side land 20, facing the electronic component-side land 30. In this case as well, gas in the generated voids may be emitted outside the soldered portion via the gap formed between the solder resist layer and the electronic component-side land 30.

What is claimed is:

1. An electronic component to be mounted on a substrate, comprising:
a plurality of component-side lands having areas of different sizes, one of the electronic component-side lands faces a substrate-side land provided on the substrate when the electronic component is mounted on the substrate, wherein
a non-soldered region is provided on a surface of the one electronic component-side land, facing the substrate-side land, so that a shape of the substrate-side land is different from a shape of the one electronic component-side land facing the substrate-side land,
wherein the non-soldered region is provided on the one electronic component-side land which has the largest area among the plurality of electronic component-side lands.

2. The electronic component according to claim 1, wherein the plurality of electronic component-side lands are provided near an outer periphery of a surface of the electronic component, facing the substrate, and
the non-soldered region is provided on the electronic component-side land having the largest area among the plurality of electronic component-side lands provided near the outer periphery of the surface of the electronic component, facing the substrate.

3. The electronic component according to claim 1, wherein the electronic component-side land is divided by the non-soldered region, and
a planar shape of the electronic component-side land divided by the non-soldered region is different from a planar shape of the substrate-side land at a position facing the divided electronic component-side land.

4. An electronic component o be mounted on a substrate, comprising:
an electronic component-side land that faces a substrate-side land provided on the substrate when the electronic component is mounted on the substrate, wherein
a non-soldered region is provided on a surface of the electronic component-side land, facing the substrate-side land, so that a shape of the substrate-side land is different from a shape of the electronic component-side land facing the substrate-side land,
wherein a groove is provided on the surface of the electronic component-side land, facing the substrate-side land, as the non-soldered region,
wherein a thickness of the electronic component-side land at a position of the groove different from a thickness of the substrate-side land at a position facing the groove.

5. The electronic component according to claim 4, wherein a solder resist layer is provided on the surface of the electronic component-side land, facing the substrate-side land, as the non-soldered region.

6. An electronic component to be mounted on a substrate, comprising:
electronic component-side lands that respectively face substrate-side lands provided on the substrate when the electronic component is mounted on the substrate, wherein
the electronic component-side lands include a grounding land that is provided substantially at a center of a surface of the electronic component, facing the substrate, and input/output lands that are provided around the grounding land, the input/output lands include a reinforcement land that is provided near an outer periphery of the surface of the electronic component, facing the substrate, and that is formed to have an area larger than that of the other input/output land, and a non-soldered region is provided on a surface of the reinforcement land, facing the substrate-side land, so that a shape of the substrate-side land is different from a shape of the reinforcement land facing the substrate-side land.

7. An electronic device comprising:

a substrate that includes a substrate-side land; and an electronic component that includes a plurality of electronic component-side lands having areas of different sizes, one of the electronic component-side lands facing the substrate-side land when the electronic component is mounted on the substrate, wherein a non-soldered region is provided on at least one of a surface of the substrate-side land, facing the one electronic component-side land, and a surface of the one electronic component-side land, facing the substrate-side land, so that a shape of the substrate-side land is different from a shape of the one electronic component-side land facing the substrate-side land, wherein the non-soldered region is provided on the one electronic component-side land, which is the electronic component-side land having a largest area among the plurality of electronic component-side lands.

* * * * *